(12) United States Patent
Kawaai et al.

(10) Patent No.: US 8,278,975 B2
(45) Date of Patent: Oct. 2, 2012

(54) SINUSOIDAL WAVEFORM GENERATION CIRCUIT

(75) Inventors: Ryoji Kawaai, Kariya (JP); Hiroshi Ogura, Okazaki (JP); Yukinori Harada, Anjo (JP)

(73) Assignee: Denso Corporation, Kariya (JP)

( * ) Notice: Subject to any disclaimer, the term of this patent is extended or adjusted under 35 U.S.C. 154(b) by 238 days.

(21) Appl. No.: 12/798,003

(22) Filed: Mar. 26, 2010

(65) Prior Publication Data

US 2010/0244910 A1 Sep. 30, 2010

(30) Foreign Application Priority Data

Mar. 27, 2009 (JP) .................................. 2009-079803

(51) Int. Cl.
*H03B 28/00* (2006.01)

(52) U.S. Cl. .......................... 327/129; 327/108; 327/112

(58) Field of Classification Search .................. 327/108, 327/112, 129, 427, 430, 431, 434, 437
See application file for complete search history.

(56) References Cited

U.S. PATENT DOCUMENTS 6,977,533 B2 * 12/2005 Kernhof et al. ............... 327/110
2004/0141560 A1 7/2004 Koyasu

* cited by examiner

*Primary Examiner* — Lincoln Donovan
*Assistant Examiner* — Diana J Cheng
(74) *Attorney, Agent, or Firm* — Harness, Dickey & Pierce, PLC

(57) ABSTRACT

A sinusoidal waveform generation circuit is configured to continuously control a voltage applied to a gate of a MOSFET to change an output current in the form of a sinusoidal wave by utilizing, as an electric characteristic specific to the MOSFET, a characteristic between a voltage applied to a gate of a MOSFET and an output current. The waveform of the sinusoidal wave generated by the sinusoidal waveform generation circuit is not a combination of a plurality of linear lines but is continuous and smooth. As a result, noises generated by the sinusoidal waveform generation circuit can be reduced.

6 Claims, 7 Drawing Sheets

SINUSOIDAL WAVEFORM GENERATION CIRCUIT

CROSS REFERENCE TO RELATED APPLICATION

This application is based on and incorporates herein by reference Japanese Patent Application No. 2009-79803 filed on Mar. 27, 2009.

FIELD OF THE INVENTION

The present invention relates to a sinusoidal waveform generation circuit, which generates a sinusoidal wave based on a sinusoidal waveform generation command inputted from an external side.

BACKGROUND OF THE INVENTION

As a conventional waveform generation circuit, JP 2004289597A (US 2004/0141560 A1) discloses one exemplary circuit, which includes a switching element, a monitor circuit, an output current control circuit and the like. The monitor circuit is configured to monitor an output current flowing in the switching element when the switching element is turned on. The output current control circuit is configured to switch in steps a slope (change rate) of the output current based on the monitor result of the monitor circuit, so that the output current of the switching element changes in the form of the sinusoidal wave.

According to the conventional exemplary waveform generation circuit, the slope of the output current is switched over in steps. As a result, the waveform of the sinusoidal wave results in a combination of a plurality of straight lines. At each part (angle), where the slope of the output current changes, noises are generated.

SUMMARY OF THE INVENTION

It is therefore an object of the present invention to reduce noises generated from a sinusoidal waveform generation circuit.

According to the present invention, a sinusoidal waveform generation circuit is provided for generating a sinusoidal waveform based on a waveform generation command inputted from an external side. The sinusoidal waveform generation circuit includes a MOSFET and a gate voltage application section. The MOSFET has a gate, a drain and a source and produces an output current from the drain to the source when a voltage is applied to the gate. The gate voltage application section applies the gate voltage to the gate of the MOSFET when the sinusoidal waveform generation command is inputted. The voltage application section is configured to change the output current in a form of a sinusoidal wave by continuously applying the voltage to the gate of the MOSFET based on an electric characteristic between a gate voltage and an output current in a MOSFET.

Preferably, a capacitor is connected to the gate and the source of the MOSFET, respectively, so that the voltage applied to the gate of the MOSFET is changed approximately in a sinusoidal waveform.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
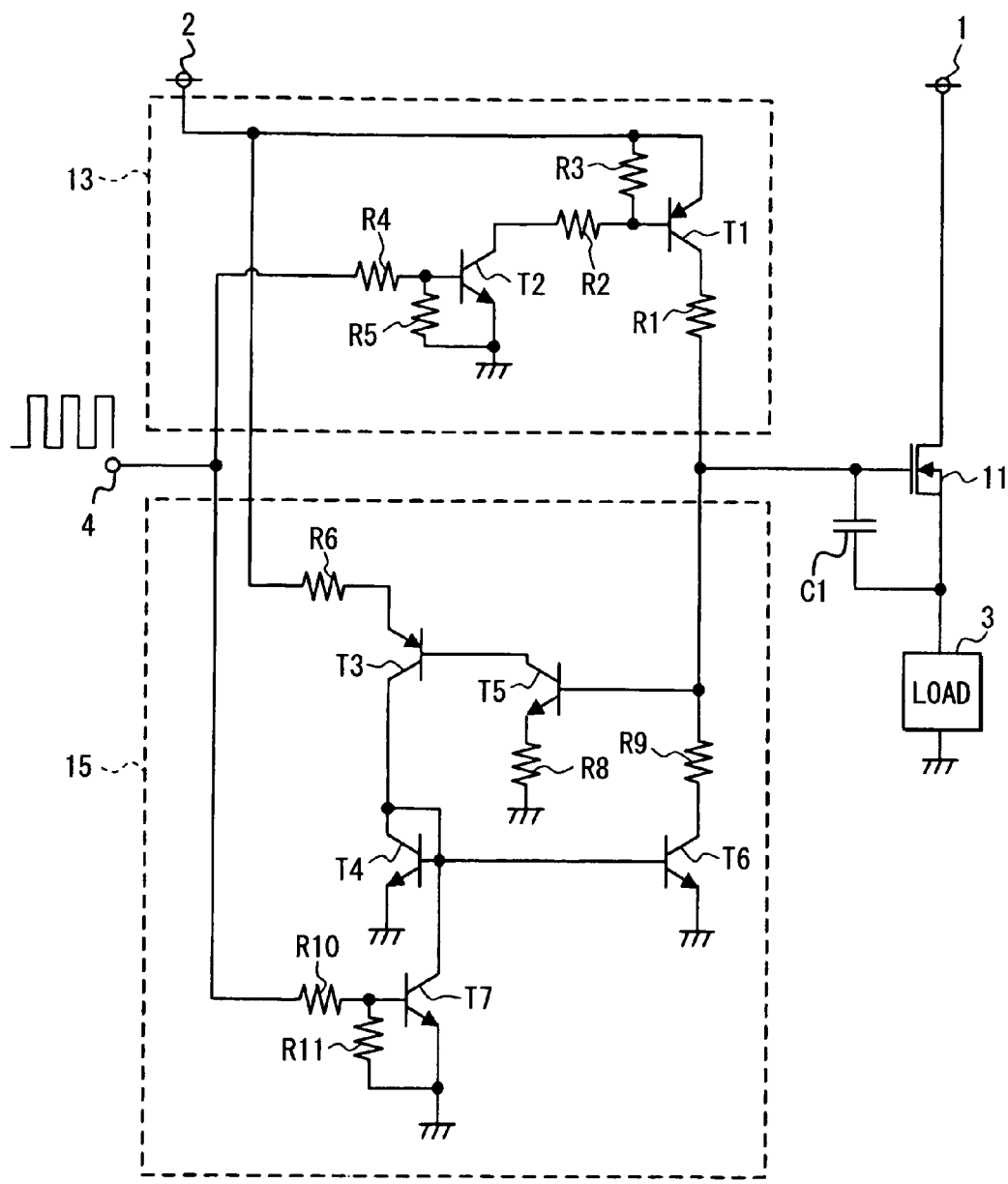
FIG. 1 is a circuit diagram showing a sinusoidal waveform generation circuit according to a first embodiment of the present invention.

The present invention will be described in more detail with reference to a plurality of embodiments shown in the drawings. In the embodiments, a sinusoidal waveform generation circuit is configured to generate an output current, which changes into a sinusoidal waveform, based on a pulse-width modulated signal (PWM signal) inputted from an external side. The sinusoidal waveform generation circuit may be used for light dimmer control or communications control in a vehicle.

First Embodiment

Referring to FIG. 1, a sinusoidal waveform generation circuit is configured with a MOSFET 11, a capacitor C1 connected to the gate and the source of the MOSFET 11, a charge circuit 13 for charging the capacitor C1, a discharge circuit 15 for discharging the capacitor C1, and the like.

The capacitor C1 has a capacitance larger than a parasitic capacitance of the MOSFET 11. The drain of the MOSFET 11 is connected to a DC power source 1 of 12 volts, the source of the MOSFET 11 is grounded through an electric load 3, and the gate of the MOSFET 11 is connected to the charge circuit 13 and the discharge circuit 15. The MOSFET 11 supplies an output current Id from the drain to the source, when a voltage is applied to its gate.

The charge circuit 13 and the discharge circuit 15 is connected to receive a PWM signal from an external side through an input terminal 4 and apply the voltage to the gate of the MOSFET 11 based on the PWM signal.

The charge circuit 13 is configured with transistors T1, T2, resistors R1 to R5 and the like.

The transistor T1 is a p-n-p type transistor. The emitter of the transistor T1 is connected to a DC power source 2, the voltage of which is 12 volts higher than that of the DC power source 1. The collector of the transistor T1 is connected to the gate of the MOSFET 11 through the resistor R1. The base of the transistor T1 is connected to the collector of the transistor T2 through the resistor R2. The emitter and the base of the transistor T1 are connected to each other through the resistor R3.

The transistor T2 is a n-p-n type transistor. The emitter of the transistor T2 is grounded. The base of the transistor T2 is connected to the input terminal 4 of the PWM signal through the resistor R4. The emitter and the base of the transistor T2 are connected to each other through the resistor R5.

The discharge circuit 15 is configured with transistors T3 to 17, resistors R6 to R11 and the like.

The transistor T3 is a p-n-p type transistor. The emitter of the transistor T3 is connected to the DC power source 2 through the resistor R6. The collector of the transistor T3 is connected to the collector of the transistor T4. The base of the transistor T3 is connected to the collector of the transistor T5.

The transistor T4 is a n-p-n type transistor. The emitter of the transistor T4 is grounded. The base of the transistor T4 is connected to the base of the transistor T6. The collector and the base of the transistor T4 are connected to each other.

The transistor T5 is a n-p-n type transistor. The emitter of the transistor T5 is grounded through the resistor R8. The base of the transistor T5 is connected to a junction between the resistor R1 of the charge circuit 13 and the gate of the MOSFET 11.

The transistor T6 is a n-p-n type transistor. The collector of the transistor T6 is connected to a junction between the base of the transistor T5 and the gate of the MOSFET 11 through the resistor R9. The emitter of the transistor T6 is grounded.

The transistor 17 is a n-p-n type transistor. The collector of the transistor 17 is connected to a junction between the base of the transistor T4 and the base of the transistor T6. The emitter of the transistor 17 is grounded. The base of the transistor 17 is connected to a junction between the input terminal 4 of the PWM signal and the resistor R4 through the resistor R10. The base and the emitter of the transistor 17 are connected to each other through the resistor R11.

The resistors R1 and R6 have the same resistance. The resistor R1 of the charge circuit 13 and the capacitor C1 form a series RC circuit. The MOSFET 11 receives at the gate thereof the voltage, which continuously changes based on the time constant determined by the resistor R1 and the capacitor C1, so that the output current Id changes in the sinusoidal waveform.

The resistance of the resistor R1 is determined in the following way.

Figure 2:
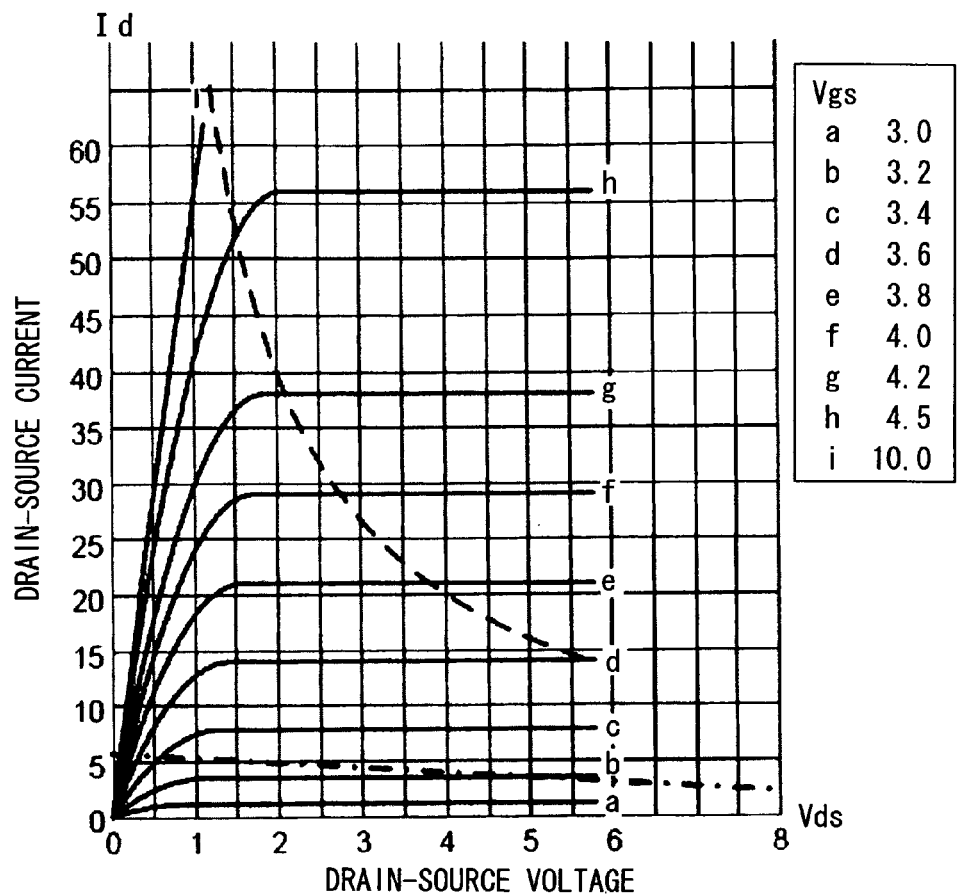
FIG. 2 is a graph showing a voltage-current characteristic of a MOSFET in the first embodiment.

The MOSFET 11 has an electric characteristic shown in FIG. 2, which shows a relation among a voltage Vds between the drain and the source, a voltage Vgs between the gate and the source and an output current Id, which flows from the drain to the source. The MOSFET 11 also has another electric characteristic shown in FIG. 3, which shows a time change of the voltage Vs applied to the source.

As shown in FIG. 2, the output current Id of the MOSFET 11 increases in proportion to the drain-source voltage Vds, and stops increasing and saturates when the output current Id reaches predetermined current values. The predetermined current values, at which the output current Id stops increasing and saturate, are larger as the gate-source voltage Vgs is larger.

Figure 3:
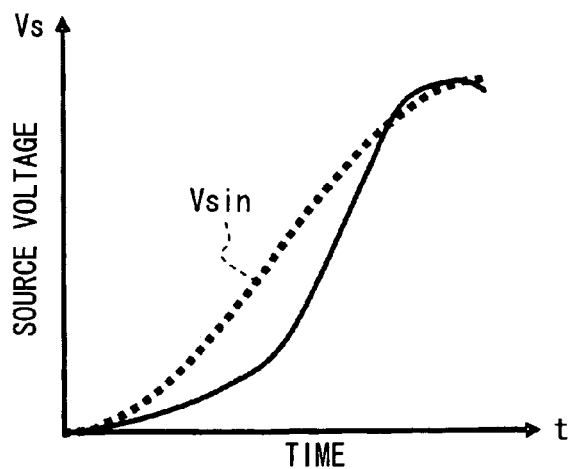
FIG. 3 is a graph showing a time-voltage characteristic of the MOSFET in the first embodiment.

If the gate-source voltage Vgs is assumed to increase at a fixed rate from "a (3.0)" to "i (10.0)" as indicated in FIG. 2, the source voltage Vs applied to the source of the MOSFET 11 and hence the output current Id changes as indicated by a solid line in FIG. 3, in which a sinusoidal wave is indicated as Vsin by a dotted line.

The source voltage Vs (output current Id) is changed to approximately follow the sinusoidal wave. For this purpose, the ratio of the source voltage Vs (solid line waveform) relative to the sinusoidal wave voltage Vsin (dotted line) may be calculated from time to time, and the source voltage Vs may be increased in correspondence to the calculated ratio to attain approximately the sinusoidal wave voltage Vsin at earlier time.

The time required for the source voltage Vs to be increased to the sinusoidal wave voltage Vsin is changeable by the time constant of the series RC circuit formed by the resistor R1 and the capacitor C1. Therefore, as one example, the resistance of the resistor R1 is set in correspondence to the calculated ratio so that the output current Id changes approximately in the sinusoidal waveform.

According to the first embodiment, the output current Id is generated in the sinusoidal waveform by continuously applying the voltage to the gate of the MOSFET 11 based on the characteristic of the MOSFET 11 between its gate-source voltage Vgs and the output current Id.

In operation, the transistors T1 and T2 of the charge circuit 13 are turned on when the PWM signal inputted to the input terminal 4 is changed from a low level to a high level. The voltage of the DC power source 2 is applied to the gate of the MOSFET 11 and the capacitor C1 is charged to store electric charge.

Figure 4:
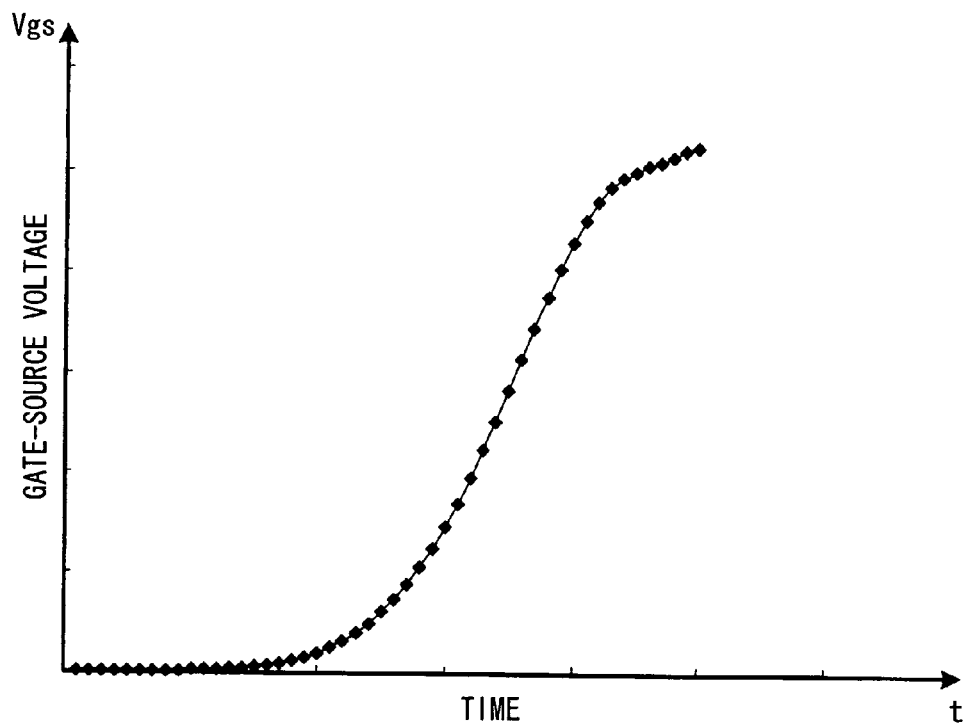
FIG. 4 is a graph showing an operation of the first embodiment.

As a result, the gate-source voltage Vgs increases in a non-linear curve shown in FIG. 4, that is, at different rates determined by the time constant of the resistor R1 and the capacitor C1. The transistors T3,T5 and 17 of the discharge circuit 15 are also turned on, when the high level of the PWM signal is inputted to the input terminal 4.

Figure 5A:
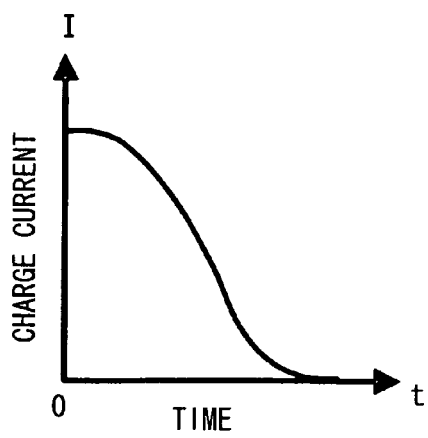
FIGS. 5A and 5B are graphs showing operations of the first embodiment.

A current I flowing to the gate of the MOSFET 11 (charge current flowing to the capacitor C1) is gradually decreased as shown in FIG. 5A in reverse relation to the gate-source voltage Vgs of the MOSFET 11 shown in FIG. 4. The charge current I stops flowing when the capacitor C1 is fully charged.

When the PWM signal inputted to the input terminal 4 is changed from the high level to the low level thereafter, the transistors T1, T2 of the charge circuit 13 are turned off. In the discharge circuit 15, the transistor 17 is turned off and the transistors T3 to T6 are turned on.

Figure 5B:
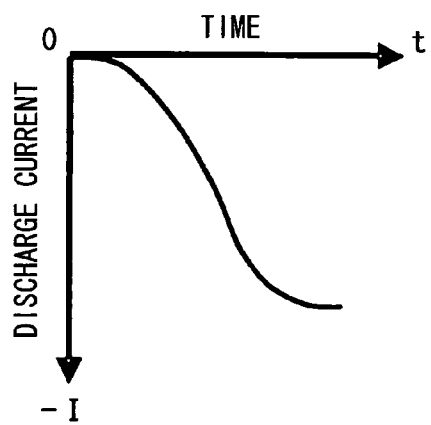

As a result, since the resistances of the resistors R1 and R6 are the same, the discharge current flowing to the gate of the MOSFET 11 decreases in the same characteristic curve as the charge current as shown in FIG. 5B.

As far as the resistances of the resistors R1 and R6 are the same, the voltage applied to the gate of the MOSFET 11 and the voltage applied to the emitter of the transistor T3 are equal. As a result, the waveform of the charge current flowing to the capacitor C1 from the charge circuit 13 at the time of charging is the same as the waveform of the discharge current flowing to the discharge circuit 15 from the capacitor C1 at the time of discharging.

When the electric charge stored in the capacitor C1 is discharged fully, the transistors T3 to T6 of the discharge circuit 15 are turned off. As described above, the output current Id in the form of the sinusoidal wave flows from the time, at which the charge current starts to flow in response to the start of input of the high level of the PWM signal, until the time, at which the charge current stops flowing to the gate of the MOSFET 11 in response to the input of the low level of the PWM signal.

According to the first embodiment, by utilizing the characteristic between the voltage applied to the gate of the MOSFET 11 and the output current Id as the electric characteristic specific to the MOSFET 11, the voltage is applied continuously to the gate of the MOSFET 11 as shown in FIG. 4 and the waveform of the output current Id is shaped in the sinusoidal waveform. As a result, the sinusoidal wave (output current Id) is generated continuously.

The waveform of the sinusoidal wave generated by the sinusoidal waveform generation circuit is not a combination of a plurality of different linear lines but is a continuous, smooth wave. Thus, noises generated from the sinusoidal waveform generation circuit are reduced.

Further, since the sinusoidal waveform generation circuit does not have a monitor circuit (feedback circuit), which monitors the output current Id, the sinusoidal waveform generation circuit can be configured small in size and low in cost.

By utilizing the characteristic of the capacitor C1, the voltage applied to the gate of the MOSFET 11 is restricted from increasing abruptly. Since the rate of change of the output current Id can thus be restricted, the waveform of the output current Id can be smoothed.

Since the capacitance of the capacitor C1 is larger than the parasitic capacitance of the MOSFET 11, influence of individual variations among MOSFETs can be reduced.

The charge circuit 13 and the discharge circuit 15 operate as a gate voltage application section.

Second Embodiment

Figure 6:
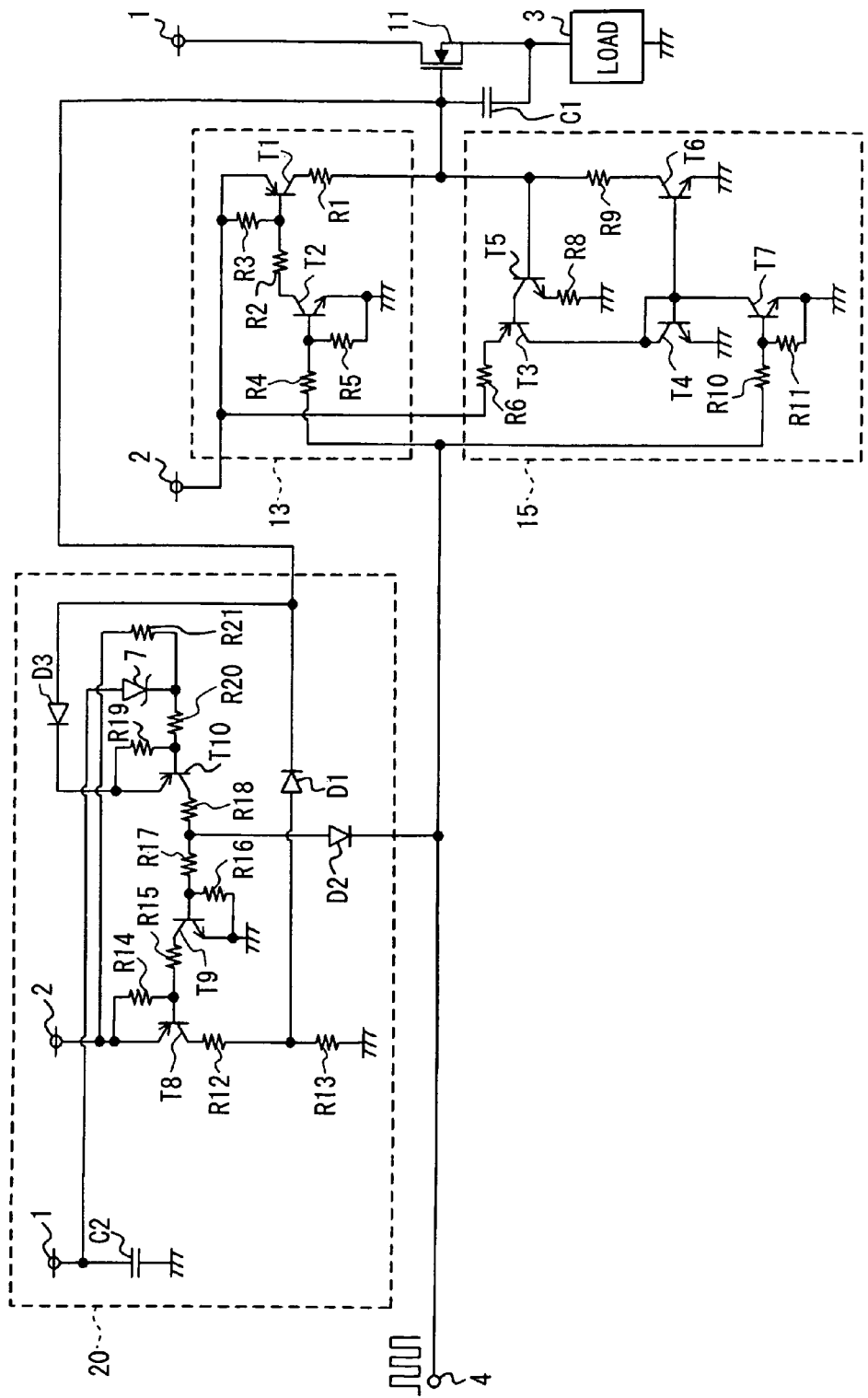
FIG. 6 is a circuit diagram showing a sinusoidal waveform generation circuit according to a second embodiment of the present invention.

According to a second embodiment, the sinusoidal waveform generation circuit is additionally provided with a rapid charge/discharge circuit 20 as shown in FIG. 6. The MOSFET 11, the capacitor C1, the charge circuit 13 and the discharge circuit 15 are arranged in the same configuration as in the first embodiment.

The rapid charge/discharge circuit 20 is configured to apply a high voltage, which is higher than that applied to the MOSFET 11 by the charge circuit 13 and the discharge circuit 15, to the gate of the MOSFET 11. The circuit 20 is configured with a capacitor C2, transistors T8 to T10, diodes D1 to D3, resistors R12 to R21, a Zener diode 7 and the like.

The capacitor C2 is connected to the DC power source 1 and the ground. The transistor T8 is a p-n-p type transistor. The emitter of the transistor T8 is connected to a DC power source 2 having a supply voltage of 24 volts, which is higher than that of the DC power source 1. The collector of the transistor T8 is connected to the resistor R12, which is grounded through the resistor R13.

A junction between the resistors R12 and R13 is connected to the anode of the diode D1. The cathode of the diode D1 is connected to the gate of the MOSFET 11. The base and the emitter of the transistor T8 are connected to each other through the resistor R14. The base of the transistor T8 is connected to the collector of the transistor T9 through the resistor R15.

The transistor T9 is a n-p-n type transistor. The emitter of the transistor T9 is grounded. The base and the emitter of the transistor T9 are connected to each other through the resistor R16. The base of the transistor T9 is connected to the resistor R17.

The resistor 17 is connected to the collector of the transistor T10 through the resistor R18. A junction between the resistors R17 and R18 is connected to the anode of the diode D2. The cathode of the diode D2 is connected to the input terminal 4 of the PWM signal.

The transistor T10 is a p-n-p type transistor. The base and the emitter of the transistor 110 are connected to each other through the resistor R19. The emitter of the transistor T9 is connected to the cathode of the diode D3. The anode of the diode D3 is connected to a junction between the diode D1 and the MOSFET 11.

The base of the transistor T10 is connected to the resistor R20, which is connected to the resistor R21. The resistor R21 is connected to a junction between the DC power source 2 and the emitter of the transistor T8. A junction between the resistors R20 and R21 is connected to the cathode of the Zener diode 7. The anode of the Zener diode 7 is connected to the junction between the DC power source 1 and the capacitor C2.

Figure 7:
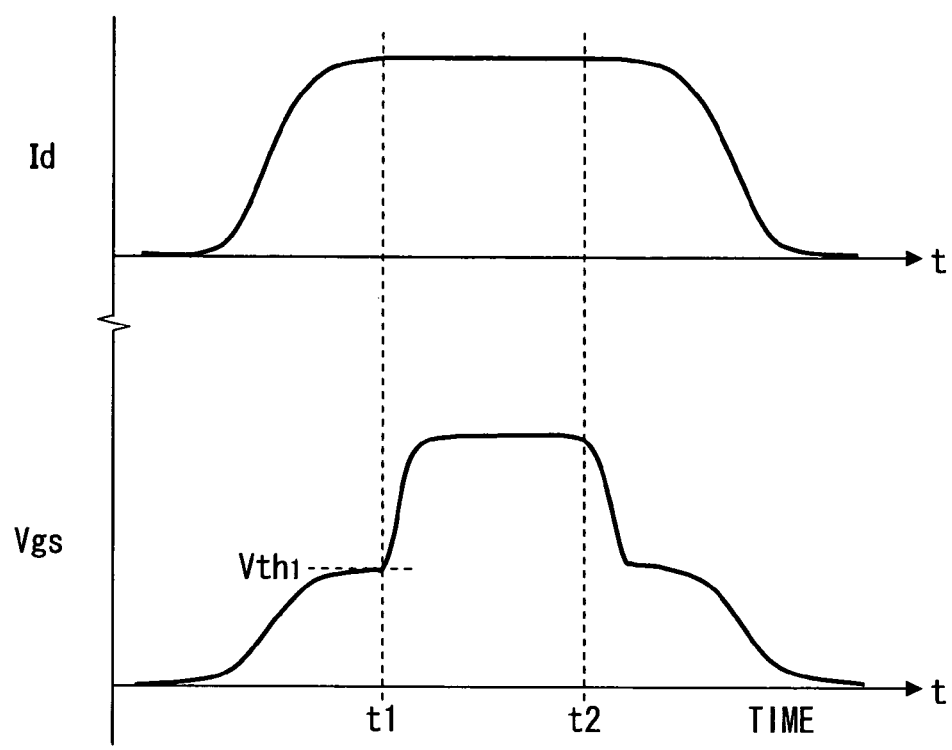
FIG. 7 is a waveform diagram showing an operation of the second embodiment.

According to the rapid charge/discharge circuit 20, as shown in FIG. 7, the transistor T10 is turned on at time t1, when the voltage applied to the gate of the MOSFET 11 reaches a predetermined voltage value Vth1 (about 12 to 15 volts) due to charging of the capacitor C1 by the charge circuit 13. The time t1, that is, the predetermined voltage value Vth1 is determined by the Zener diode 7.

The transistors T8 and T9 are also turned on, and a current flows to the gate of The MOSFET 11 and the capacitor C1 from the DC power source 2, which supplies the higher voltage than that of the DC power source 1. As a result, the voltage applied to the gate of the MOSFET 11 rapidly increases.

When the PWM signal is changed to the low level at time t2, the transistors T8 to T10 are tuned off. The current stops flowing from the DC power source 2 to the gate of the MOSFET 11 and the capacitor C1.

According to the second embodiment, since the rapid charge/discharge circuit 20 also applies the voltage to the gate of the MOSFET 11 in addition to that of the charge circuit 13 and the discharge circuit 15, the interval of time required for the voltage applied to the gate of the MOSFET 11 to converge can be shortened. Thus, heat generated by the MOSFET 11 when the voltage is applied to the gate of the MOSFET 11 can be reduced.

The rapid charge/discharge circuit 20 operates as a high voltage application section.

Third Embodiment

Figure 8:
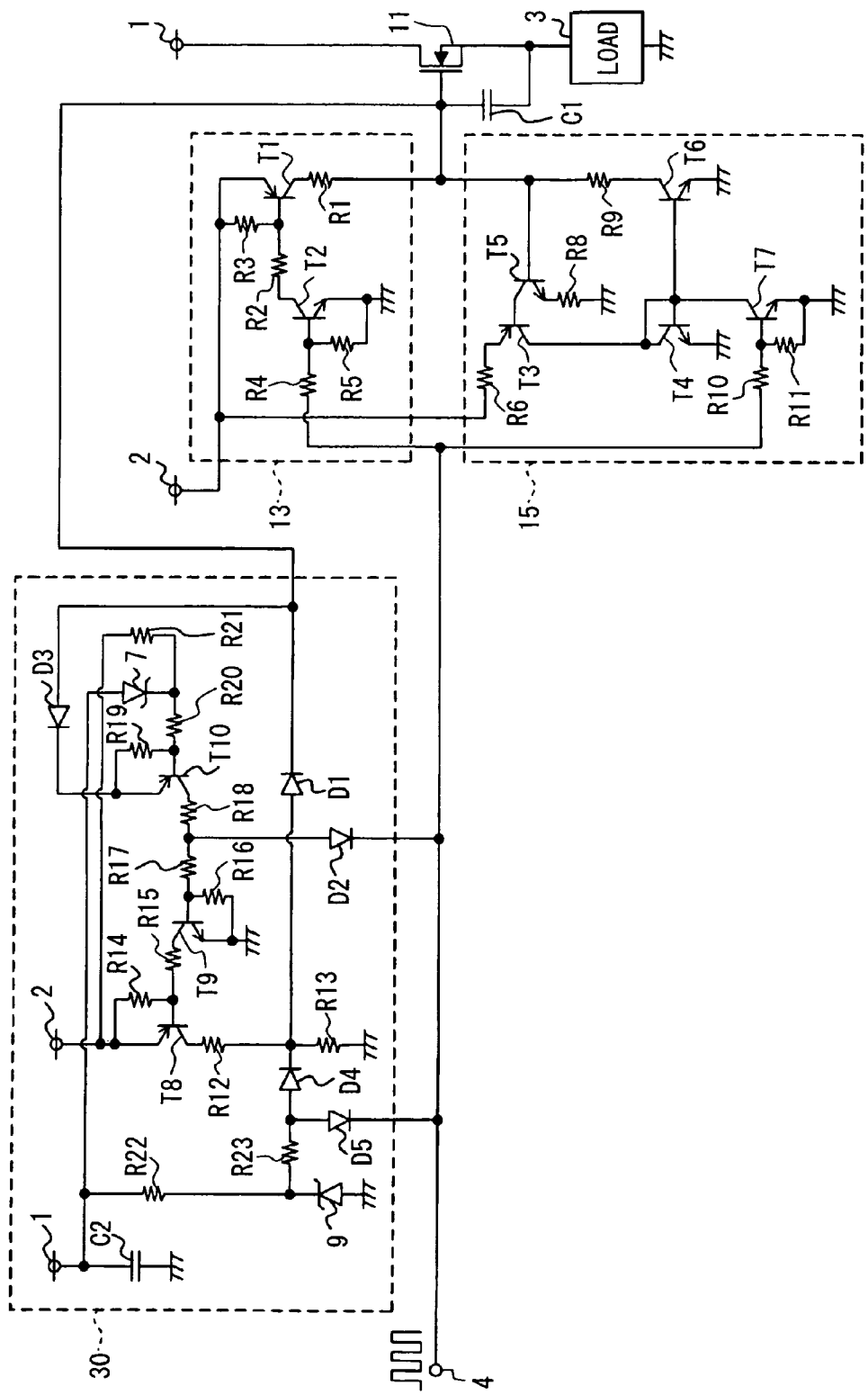
FIG. 8 is a circuit diagram showing a sinusoidal waveform generation circuit according to a third embodiment of the present invention.

According to a third embodiment relative to the charge/discharge circuit 20 of the second embodiment, as shown in FIG. 8, the sinusoidal waveform generation circuit has a rapid charge/discharge circuit 30. This rapid charge/discharge circuit 30 is configured to apply the voltage to the gate of the MOSFET 11 from time, at which the application of voltage to the gate of the MOSFET 11 by the charge circuit 13 and the discharge circuit 15 is started, to time, at which the voltage at the gate of the MOSFET 11 reaches the predetermined value.

Specifically, the rapid charge/discharge circuit 30 is additionally provided with resistors 22, 23, diodes D4, D5 and a Zener diode 9 relative to the rapid charge/discharge circuit 20 of the second embodiment.

The resistor R22 is connected to a junction between the Zener diode 7 and the DC power source 1 and to the cathode of the Zener diode 9. The anode of the Zener diode 9 is grounded.

A junction between the Zener diode 9 and the resistor R22 is connected to the resistor 23, which is connected to the anode of the diode D4. The cathode of the diode. D4 is connected to a junction between the resistors R12 and R13.

The junction between the resistor R23 and the diode D4 is connected to the anode of the diode D5. The cathode of the diode D5 is connected to the input terminal 4 of the PWM signal.

Figure 9A:
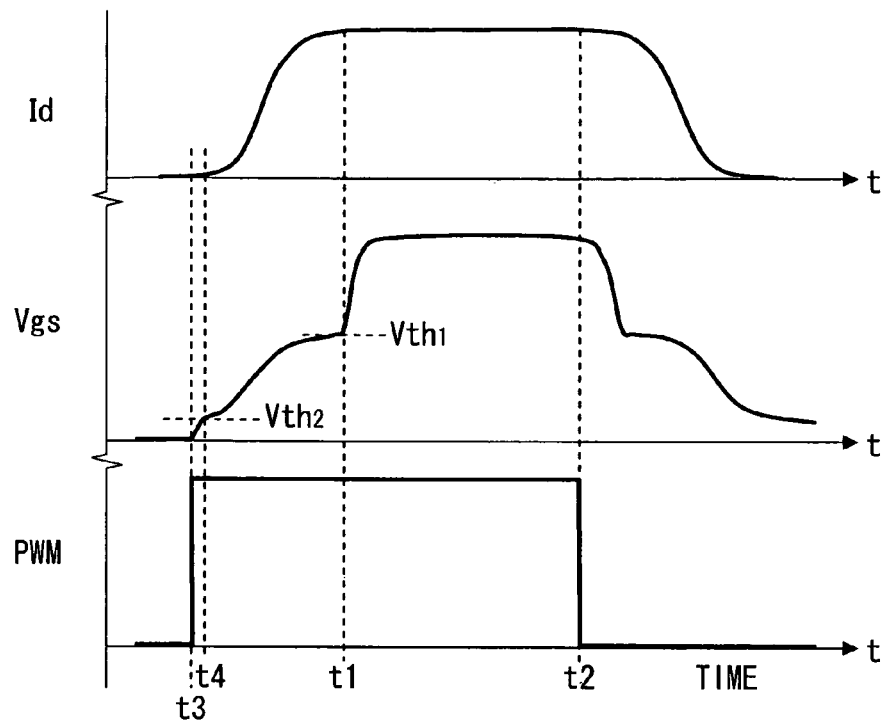
FIGS. 9A and 9B are waveform diagrams showing operations of the third embodiment and the second embodiment, respectively.

According to the rapid charge/discharge circuit 30, when the PWM signal applied to the input terminal 4 is changed from the low level to the high level at time t3 as shown in FIG. 9A, the rapid charge/discharge circuit 30 supplies a current to the gate of the MOSFET 11 and the capacitor C1. With this charge current flowing from the DC power source 1 to the gate of the MOSFET 11 and the capacitor C1, the voltage applied to the gate of the MOSFET 11 rapidly increases.

Figure 9B:
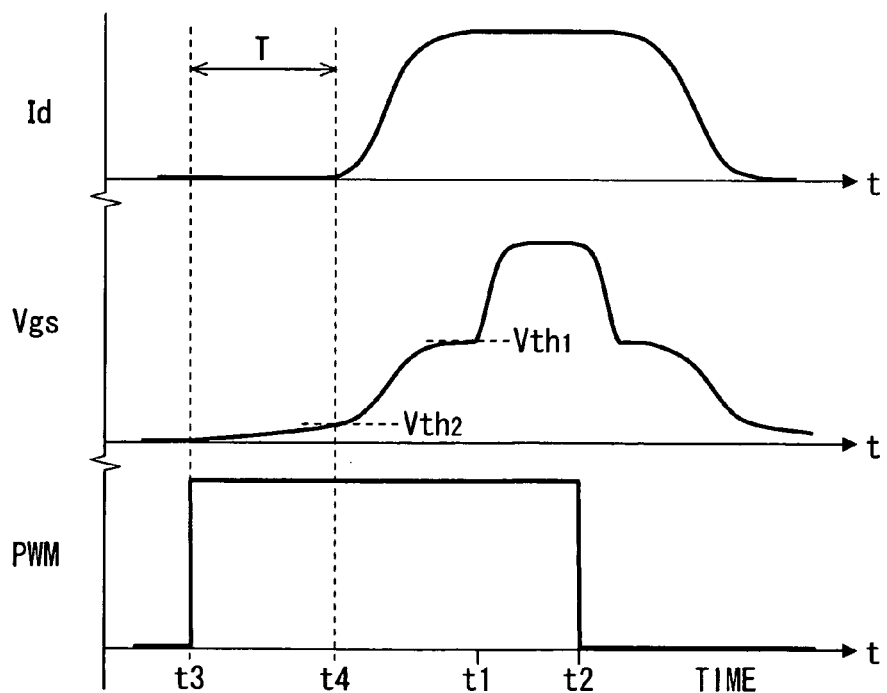

At time t4, which is slightly later than time t3, the voltage applied to the gate of the MOSFET 11 reaches a predetermined value Vth2 and the output current Id starts to flow. At the same time, the charge current stops flowing from the rapid charge/discharge circuit 30 to the MOSFET 11 and the capacitor C1. As a result, a time interval T from a start of the application of the high level of the PWM signal at time t3 until the start of flowing of the output current Id at time t4 is shortened in the third embodiment in comparison to the case of the rapid charge/discharge circuit 20 of the second embodiment, the operation of which is shown in FIG. 9B.

According to the third embodiment, the rapid charge/discharge circuit 30 also applies the voltage to the gate of the MOSFET 11 in addition to the charge circuit 13 when the high level of the PWM signal is applied. The gate voltage applied to the gate of the MOSFET 11 can be rapidly raised to the voltage level Vth2, with which the MOSFET 11 becomes capable of supplying the output current Id.

For this reason, the time interval from the start of application of the high level of PWM signal to the start of flow of the output current Id can be shortened, and hence the response of the sinusoidal wave generation circuit can be improved.

The rapid charge/discharge circuit 30 operates as an initial voltage application section.

The present invention is not limited to the above-described embodiments.

For example, the capacitor C1 provided in the embodiments need not be provided.

Although the resistors R1 and R6 are provided so that the output current Id has the waveform of the sinusoidal wave in the embodiments, the gate voltage applied to the MOSFET 11 may be continuously controlled by a central processing unit (CPU) so that the output current Id has the waveform of the sinusoidal wave.

What is claimed is:

1. A sinusoidal waveform generation circuit for generating a sinusoidal waveform based on a waveform generation command inputted from an external side, the sinusoidal waveform generation circuit comprising:
    a MOSFET having a gate, a drain and a source and producing an output current from the drain to the source when a voltage is applied to the gate;
    a gate voltage application section for applying the voltage to the gate of the MOSFET when the sinusoidal waveform generation command is inputted; and
    a capacitor having a first end connected to the gate and a second end connected to the source of the MOSFET so that the voltage applied to the gate of the MOSFET is changed approximately in a sinusoidal waveform;
    wherein the voltage application section is configured to change the output current in a form of a sinusoidal wave by continuously applying the voltage to the gate of the MOSFET based on an electric characteristic between a gate voltage and an output current in a MOSFET; and
    wherein the first end of the capacitor is connected directly to the gate of the MOSFET.

2. The sinusoidal waveform generation circuit according to claim 1, further comprising:
    a high voltage application section configured to apply, in addition to the voltage applied by the gate voltage application section, a voltage to the gate of the MOSFET thereby to increase the voltage applied to the gate of the MOSFET to be higher than that applied by the gate voltage application section, when the voltage applied to the gate of the MOSFET reaches a predetermined value.

3. The sinusoidal waveform generation circuit according to claim 2, further comprising:
    an initial voltage application section configured to apply, in addition to the voltage applied by the gate voltage application section, a voltage to the gate of the MOSFET thereby to increase the voltage applied to the gate of the MOSFET during an interval in which the voltage applied to the gate of the MOSFET rises from zero to a predetermined value, which is lower than the predetermined value, at which the high voltage application section starts to apply the voltage.

4. The sinusoidal waveform generation circuit according to claim 1, further comprising:
    an initial voltage application section configured to apply, in addition to the voltage applied by the gate voltage application section, a voltage to the gate of the MOSFET thereby to increase the voltage applied to the gate of the MOSFET during an interval in which the voltage applied to the gate of the MOSFET rises from zero to a predetermined value.

5. The sinusoidal waveform generation circuit according to claim 1, wherein:
    the capacitor has a capacitance larger than a capacitance of a parasitic capacitance of the MOSFET.

6. The sinusoidal waveform generation circuit according to claim 1, further comprising:
    a charge circuit provided between a power source and the gate of the MOSFET and including a resistor connected between the power source and the capacitor; and
    a discharge circuit provided between the power source and gate of the MOSFET and including a resistor,
    wherein the resistors in the charge circuit and the discharge circuit have same resistances to charge and discharge the capacitor with same time constants.

* * * * *